(12) United States Patent
Carbonell Maté

(10) Patent No.: US 9,509,126 B1
(45) Date of Patent: Nov. 29, 2016

(54) POWER DISTRIBUTION BOX COMPRISING A SCREW WITH A SLEEVE

(71) Applicant: LEAR CORPORATION, Southfield, MI (US)

(72) Inventor: Xavier Carbonell Maté, Valls (ES)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 14/828,911

(22) Filed: Aug. 18, 2015

(51) Int. Cl.
*H02B 1/48* (2006.01)
*H02B 1/20* (2006.01)

(52) U.S. Cl.
CPC . *H02B 1/48* (2013.01); *H02B 1/20* (2013.01)

(58) Field of Classification Search
CPC .................................. H02B 1/48; H02B 1/20
USPC .......................... 361/624; 29/825; 174/50.52
See application file for complete search history.

(56) References Cited

U.S. PATENT DOCUMENTS

| 4,952,158 | A | 8/1990 | Nakagawa | |
|---|---|---|---|---|
| 5,345,366 | A | 9/1994 | Cheng et al. | |
| 6,038,140 | A | 3/2000 | Petri | |
| 6,535,394 | B1 | 3/2003 | Hirzmann | |
| 6,543,098 | B2 * | 4/2003 | Meyer | H05K 7/142 24/289 |
| 6,679,708 | B1 * | 1/2004 | Depp | H01R 9/2466 361/752 |
| 7,544,064 | B2 | 6/2009 | Gilliland | |
| 8,777,642 | B2 * | 7/2014 | Pujol | H01R 12/53 439/97 |
| 2001/0053068 | A1 | 12/2001 | Murayama et al. | |
| 2006/0249362 | A1 | 11/2006 | Horton et al. | |
| 2011/0269320 | A1 * | 11/2011 | Roettger | H01R 9/2466 439/76.2 |
| 2014/0148020 | A1 | 5/2014 | Manushi et al. | |

* cited by examiner

*Primary Examiner* — Timothy Thompson
*Assistant Examiner* — Charles Pizzuto
(74) *Attorney, Agent, or Firm* — Dykema Gossett PLLC

(57) ABSTRACT

The present disclosure includes a power distribution box comprising a screw defining a longitudinal axis. The screw includes a screw head and a screw shank adjacent to the screw head, the screw shank includes a longitudinal end opposite the screw head. The power distribution box further includes a sleeve comprising an axially extending sleeve hole through which the screw shank extends, a circuit board, and a busbar comprising a busbar hole through which the shank of the screw extends. At least one of the sleeve and the screw is electrically coupled to the busbar, and the busbar is electrically coupled to the circuit board. The screw may be rotatably fixed relative to the circuit board, and the sleeve may be configured to receive a portion of a torque applied to the longitudinal end of the screw shank.

20 Claims, 3 Drawing Sheets

POWER DISTRIBUTION BOX COMPRISING A SCREW WITH A SLEEVE

TECHNICAL FIELD

The present disclosure relates to electrical components, including electrical connectors, electrical terminals, and/or power distribution boxes (also known as junction boxes).

BACKGROUND

This background description is set forth below for the purpose of providing context only. Therefore, any aspects of this background description, to the extent that it does not otherwise qualify as prior art, is neither expressly nor impliedly admitted as prior art against the instant disclosure.

Electrical connectors often employ internal busbars to separate an external connection to an internal connection on a circuit board. The busbars may be secured to the circuit board by soldering. When torque is applied at the external connection (e.g., a ring terminal), some of the torque may be transmitted to and received by these soldered areas, which may result in the solders breaking.

The foregoing discussion is intended only to illustrate the present field and should not be taken as a disavowal of claim scope.

SUMMARY

The present disclosure includes a power distribution box comprising a screw defining a longitudinal axis. The screw comprises a screw head and a screw shank adjacent to the screw head, the screw shank including a longitudinal end opposite the screw head. The power distribution box further comprises a sleeve comprising an axially extending sleeve hole through which the screw shank extends, a circuit board, and a busbar comprising a busbar hole through which the shank of the screw extends. At least one of the sleeve and the screw is electrically coupled to the busbar, and the busbar is electrically coupled to the circuit board. The screw is rotatably fixed relative to the circuit board, and the sleeve is configured to receive a portion of a torque applied to the longitudinal end of the screw shank.

In embodiments, a method for assembling a power distribution box may comprise providing a lower housing and inserting a screw head of a screw into a cavity of the lower housing such that the screw is rotatably fixed relative to the lower housing. The method may further comprise providing a circuit board, mounting a busbar to the circuit board, and mounting the circuit board to the lower housing such that a screw shank of the screw extends through the busbar and the circuit board. The method may further comprise inserting a sleeve over the screw shank such that a first longitudinal end of the sleeve abuts the busbar.

DETAILED DESCRIPTION

Reference will now be made in detail to embodiments of the present disclosure, examples of which are described herein and illustrated in the accompanying drawings. While the disclosure will be described in conjunction with embodiments and/or examples, it will be understood that they are not intended to limit the present disclosure to these embodiments and/or examples. On the contrary, the present disclosure is intended to cover alternatives, modifications and equivalents, which may be included within the spirit and scope of the present disclosure.

Figure 1:
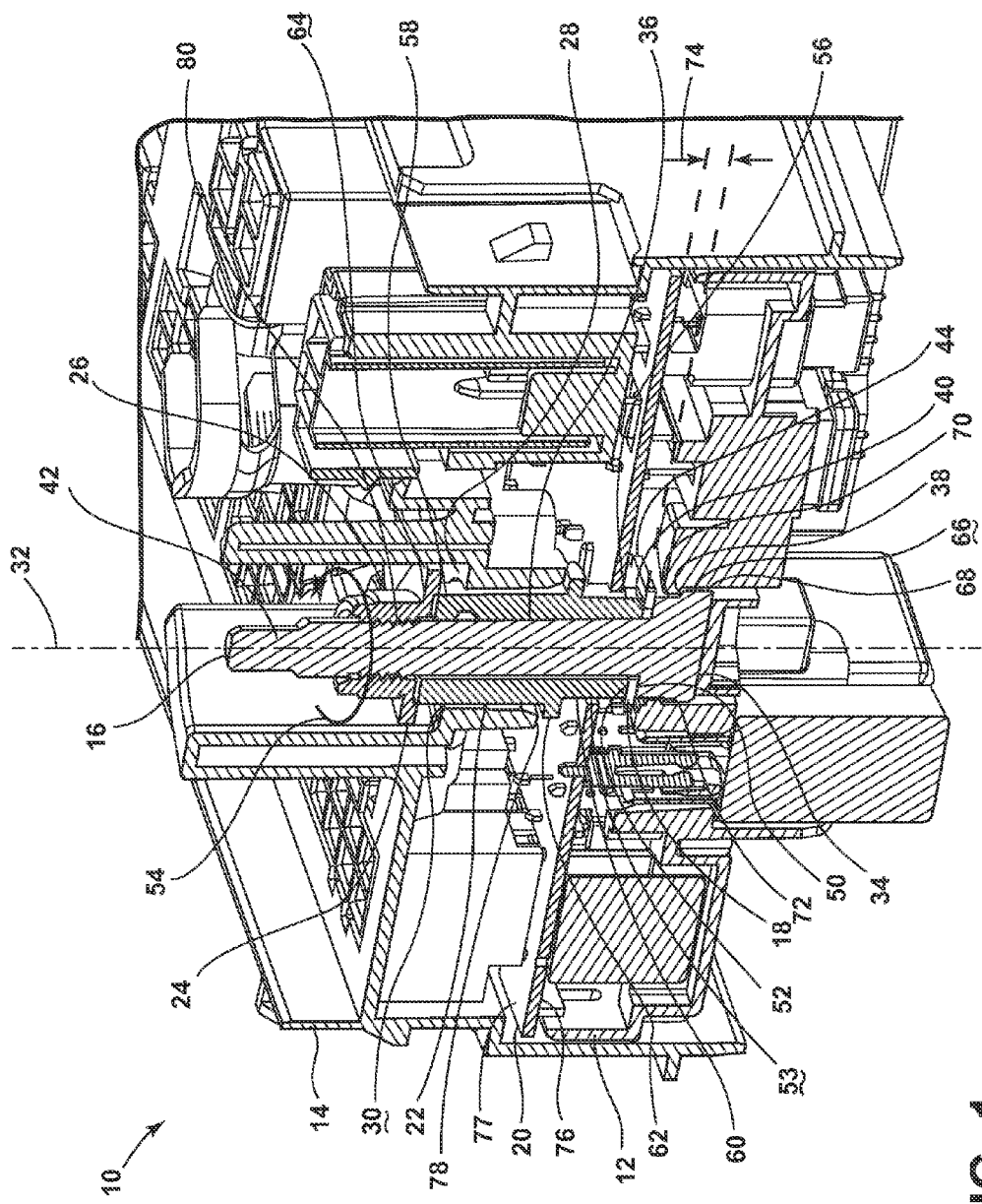
FIG. 1 is a cross-sectional isometric view of an embodiment of a power distribution box in accordance with teachings of the present disclosure.

As generally illustrated in FIG. 1, a power distribution box 10 may comprise a lower housing 12, an upper housing 14, and various components disposed therebetween, such as a screw 16, a busbar 18, a circuit board 20, a sleeve 22, a terminal 24, and a nut 26. Further exemplary descriptions of each of the foregoing components follows. Thereafter, assembly of these components will be discussed.

Generally, lower housing 12 and upper housing 14 may protect the electronic circuit from external influences (e.g., external particles, insertion forces, vibration, blows, etc.), provide mechanical location and fixation means for the external connections (e.g., wires, relays, fuses, covers, small modules, etc.), and provide the means for fixing the unit in the vehicle. Lower housing 12 may be configured to support some or all of the other components. Lower housing 12 may also be configured to include openings through which external relays and fuses may be disposed. Upper housing 14 may be configured to support terminal 24 and provide external access to circuit board 20. Upper housing 14 may also be configured to include openings for vehicle wire-harness connectors. Upper housing 14 may comprise a top surface 28 defining an upper housing hole 30 through which a screw 16 may extend. In some embodiments, lower housing 12 and upper housing 14 may generally be formed of an insulative material. In other embodiments, lower housing 12 and upper housing 14 may be formed of a conductive metallic material to increase robustness, thermal dissipation and/or EMC protection.

Figure 2:
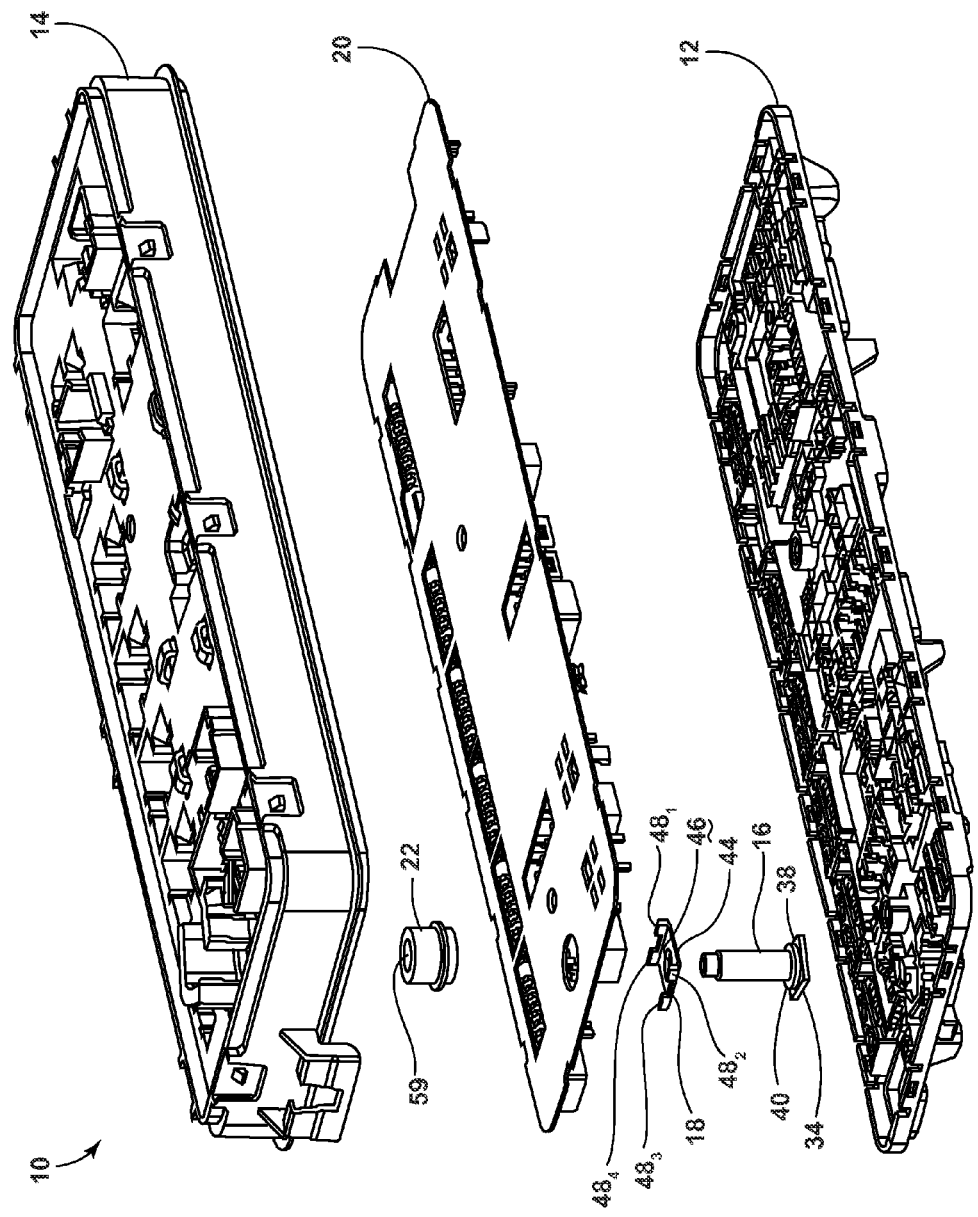
FIG. 2 is a exploded isometric view of a power distribution box as generally illustrated in FIG. 1.

Screw 16 may serve a mechanical purpose and an electrical purpose. In an embodiment, screw 16 may be configured to support busbar 18, sleeve 22, terminal 24, and nut 26 such that terminal 24 is electrically coupled to busbar 18. Screw 16 may define a longitudinal axis 32 and may comprise a screw head 34 and a screw shank 36 adjacent to screw head 34. The underside of screw head 34 may be stepped such that screw head 34 comprises two shoulders 38, 40 (for example, as generally illustrated in FIG. 2). A longitudinal end 42 of screw shank 36 may be configured to receive nut 26.

In an embodiment, busbar 18 may be configured to receive electricity transmitted from terminal 24 through screw 16 and/or sleeve 22. Busbar 18 may be electrically coupled to circuit board 20. As generally illustrated in FIG. 2, busbar 18 may comprise a generally flat portion 44 with a busbar hole 46, through which screw shank 36 may extend. Busbar 18 may further comprise at least one leg $48_{1, 2, 3, or\ 4}$ that extends from flat portion 44 to circuit board 20. In other embodiments, portion 44 of busbar 18 may not be flat. In the illustrated embodiment, there are four legs $48_{1-4}$ (see, e.g., FIG. 2). Busbar 18 may also comprise a side 50 and a side 52 opposite of side 50. In the illustrated embodiment, busbar 18 generally has a U-shape. The shape of the busbar 18 may be configured such that vertical vibrations can be absorbed in connection with the elasticity of the busbar facilitated by its shape (e.g., "U" shape). Consequently, with embodiments, the vertical vibrations may not be transferred to the areas where legs $48_{1-4}$ are coupled to circuit board 20. Circuit board 20 may comprise a circuit board hole 53 through which screw shank 36 may extend.

Sleeve 22 may be configured to receive at least a portion of a torque 54 applied to longitudinal end 42 of screw shank 36, with a torque (e.g., torque 54 generally illustrated in FIG. 1) being applied, at least in part, via rotation of nut 26. Sleeve 22 may comprise longitudinal end 56, a longitudinal end 58 opposite longitudinal end 56, and an axially extending sleeve hole 59 (as best shown in FIG. 2) through which screw shank 36 may extend. In the illustrated embodiment, sleeve 22 may be generally cylindrical in shape and may comprise an outer surface 60 with a lip 62 extending therefrom. Lip 62 may be disposed between longitudinal ends 56, 58 and may comprise an annular ring extending radially outwardly from outer surface 60.

Referring back to FIG. 1, nut 26 may be configured to secure terminal 24 to sleeve 22 and screw 16. Nut 26 may be received by longitudinal end 42 of screw shank 36. Terminal 24 may be electrically coupled to sleeve 22. Terminal 24 may comprise a terminal hole 64 through which screw shank 36 may extend. In an embodiment, nut 26 and terminal 24 may be formed of an electrically conductive material. For example and without limitation, nut 26 may be comprised of steel, and may be plated with a corrosion-resistant material, and terminal 24 may be comprised of brass or copper, and may include a tin plating. Furthermore, although nut 26 and terminal 24 are illustrated as being two separate components, nut 26 and terminal 24 may comprise one single unitary component in various embodiments.

A description of how the various components of power distribution box 10 may be assembled and interact with each other will next be described. With reference to FIG. 1, screw head 34 may be disposed in a cavity 66 of lower housing 12. In an embodiment, screw head 34 may comprise a portion 68 with a shoulder 38 and another portion 70 with a shoulder 40. Shoulder 38 of screw head 34 (also shown in FIG. 2) may abut a lip 72 of lower housing 12 to constrain axial movement of screw 16. Portion 68 of screw head 34 and/or cavity 66 may be configured or shaped such that screw 16 is rotatably fixed relative to lower housing 12 and/or circuit board 20. In the illustrated embodiment, portion 68 of screw head 34 and cavity 66 of lower housing 12 are square-shaped; however, one of ordinary skill in the art will understand that a number of configurations or shapes can be employed for portion 68 of screw head 34 and/or cavity 66 of lower housing 12 such that screw 16 may be rotatably fixed relative to lower housing 12 and/or circuit board 20. Moreover, portion 68 of screw head 34 does not have to have the same shape as cavity 66. In the illustrated embodiment, portion 70 of screw head 34 is ring-shaped; however, one of ordinary skill in the art will understand that portion 70 can have any number of shapes in accordance with other embodiments. In embodiments, a shoulder 40 of portion 70 may abut side 50 of busbar 18.

In an embodiment, busbar 18 may be coupled to circuit board 20. In the illustrated embodiment, legs $48_{1-4}$ (as best shown in FIG. 2) of busbar 18 extend through circuit board 20. In an embodiment, legs $48_{1-4}$ are soldered to circuit board 20. In the illustrated embodiment, side 52 of busbar 18 abuts longitudinal end 56 of sleeve 22, and a portion of busbar 18 is disposed between screw head 34 and sleeve 22. In this configuration, busbar 18 may have a low profile such that a height 74 between busbar 18 and circuit board 20 is minimal. This allows for the overall height of power distribution box 10 to be minimal as well. Height 74 can be adjusted depending on the application desired. In one embodiment, height 74 may be equal to or less than three millimeters.

At least one of sleeve 22 and screw 16 may be electrically coupled to busbar 18, and busbar 18 may be electrically coupled to circuit board 20. In an embodiment, longitudinal end 56 of sleeve 22 is axially disposed on side 76 of circuit board 20, and longitudinal end 58 of sleeve 22 is axially disposed on side 77 of circuit board 20. In some embodiments, lip 62 of sleeve 22 is disposed between upper housing 14 and circuit board 20, and longitudinal end 56 of sleeve 22 is disposed between circuit board 20 and screw head 34. In the illustrated embodiment, lip 62 abuts an internal surface 78 of upper housing 14 to constrain axial movement of at least sleeve 22, particularly before nut 26 is secured to screw shank 36. In some embodiments, longitudinal end 58 of sleeve 22 may protrude slightly from top surface 28 of upper housing 14 such that terminal 24 can abut longitudinal end 58 of sleeve 22. Although sleeve 22 is illustrated as generally a bushing, one of ordinary skill in the art will understand that sleeve 22 may be a bearing or any other type of member that is configured to receive torque 54 applied at longitudinal end 42 of screw shank 36.

In an embodiment, a portion of terminal 24 may be disposed between longitudinal end 58 of sleeve 22 and nut 26. Nut 26 may be inserted or torqued onto a threaded portion 80 of screw shank 36 such that nut 26 constrains movement of terminal 24 and sleeve 22. Torque 54 applied at longitudinal end 58 of screw shank 36 may be received largely by sleeve 22 such that little to no torque is received by busbar 18, which prevents the soldered areas of busbar 18 (on circuit board 20) from breaking. The disclosed configuration may provide electrical connection between terminal 24 and circuit board 20 while avoiding the transmission of mechanical stress through the same path. This mechanical stress may be transferred directly to lower housing 12 (due to, in part, rotational fixation of screw 16) and/or to sleeve 22 such that little to no stress is received by the busbar mechanical interface.

In the illustrated embodiment, nut 26, portion of terminal 24 disposed between nut 26 and sleeve 22, sleeve 22, screw 16, and busbar 18 are coaxially aligned relative to longitudinal axis 32.

Figure 3B:
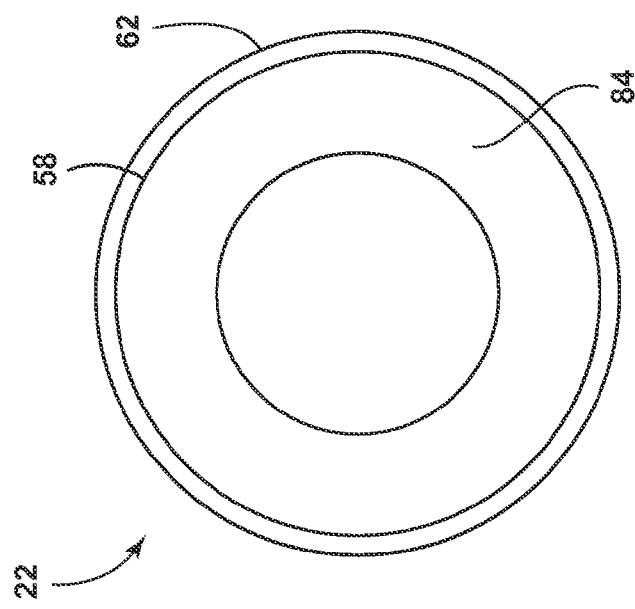
FIGS. 3A and 3B are top and bottom plan views of a sleeve of a power distribution box, such as generally illustrated in FIG. 1.
Figure 3A:
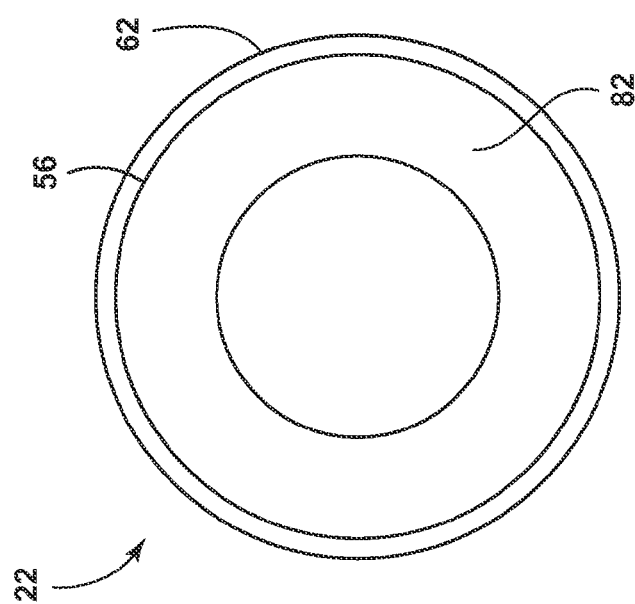

Referring to FIGS. 3A and 3B, longitudinal end 56 of sleeve 22 may have a contact area 82, and longitudinal end 58 of sleeve 22 may have a contact area 84. As shown in FIG. 1, contact areas 82, 84 may abut side 52 of busbar 18 and terminal 24, respectively. By increasing the contact areas with terminal 24 and busbar 18 in this manner, electrical conductivity may be improved through sleeve 22, which may be formed of an electrically conductive material, such as brass, with some embodiments.

With further reference to FIGS. 1-3B, a method of assembling power distribution box 10 may comprise providing lower housing 12. The method may further comprise inserting screw head 34 of screw 16 into cavity 66 of lower housing 12 such that screw 16 is rotatably fixed relative to lower housing 12. Screw 16 may inserted manually or automatically. The method may further comprise providing circuit board 20 and mounting busbar 18 to circuit board 20. In one embodiment, mounting busbar 18 to circuit board 20 may include soldering busbar 18 to circuit board 20. In the illustrated embodiment, legs $48_{1-4}$ of busbar 18 are soldered to circuit board 20. Mounting busbar 18 to circuit board 20 may also comprise inserting screw shank 36 of screw 16 through busbar hole 46. In an embodiment, height 74 between busbar 18 and circuit board 20 is equal to or less than three millimeters.

The method may further comprise mounting circuit board 20 to lower housing 12 such that screw shank 36 of screw 16 extends through busbar 18 and circuit board 20. One of ordinary skill in the art will understand that mounting busbar 18 may occur before or after mounting of circuit board 20 to lower housing 12.

The method may further comprise inserting sleeve 22 over screw shank 36, preferably by sliding sleeve 22 over screw shank 36, such that screw shank 36 of screw 16 extends through busbar 18 and circuit board 20. In one embodiment, sleeve 22 may comprise lip 62 disposed between longitudinal end 56 of sleeve 22 and longitudinal end 58 of sleeve 22 opposite longitudinal end 56, lip 62 being configured to abut internal surface 78 of upper housing 14 to constrain axial movement of at least sleeve 22. In one embodiment, longitudinal end 56 of sleeve 22 is axially disposed on side 76 of circuit board 20, and longitudinal end 58 of sleeve 22 is axially disposed on side 77 of circuit board 20 opposite side 76 of circuit board 20.

The method may further comprise providing upper housing 14 and mounting upper housing 14 to lower housing 12 such that longitudinal end 42 of screw shank 36 is exposed through upper housing 14.

Various embodiments are described herein to various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Reference throughout the specification to "various embodiments," "some embodiments," "one embodiment," or "an embodiment," or the like, means that a particular feature, structure, or characteristic described in connection with the embodiment is included in at least one embodiment. Thus, appearances of the phrases "in various embodiments," "in some embodiments," "in one embodiment," or "in an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment may be combined, in whole or in part, with the features, structures, or characteristics of one or more other embodiments without limitation given that such combination is not illogical or non-functional.

Although only certain embodiments have been described above with a certain degree of particularity, those skilled in the art could make numerous alterations to the disclosed embodiments without departing from the scope of this disclosure. Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." throughout the specification is to be construed broadly and is used to provide non-limiting examples of embodiments of the disclosure, and the disclosure is not limited to such examples. The use of "vertical" and "horizontal" are provide for reference and it is specifically contemplated that embodiments of the present disclosure may be disposed at various angles. It is intended that all matter contained in the above description or shown in the accompanying drawings shall be interpreted as illustrative only and not limiting. Changes in detail or structure may be made without departing from the present disclosure as defined in the appended claims.

What is claimed is:

1. A power distribution box comprising:
a screw defining a longitudinal axis and comprising a screw head and a screw shank adjacent to the screw head, the screw shank including a longitudinal end opposite the screw head;
a sleeve including an axially extending sleeve hole through which the screw shank extends;
a circuit board; and
a busbar electrically coupled to the circuit board and including a busbar hole configured to permit the screw shank to extend through,
wherein at least one of the sleeve and the screw is electrically coupled to the busbar; the screw is rotatably fixed relative to the circuit board; and the sleeve is configured to receive a portion of a torque applied proximate the longitudinal end of the screw shank.

2. The power distribution box of claim 1, wherein a portion of the busbar is disposed between the screw head and the sleeve.

3. The power distribution box of claim 1, further comprising a lower housing, wherein a portion of the screw head is disposed in the lower housing, and the circuit board further comprises a circuit board hole through which the screw shank extends.

4. The power distribution box of claim 3, wherein the screw head comprises a first shoulder and a second shoulder, the first shoulder abutting a first side of the busbar and the second shoulder abutting a lip of the lower housing.

5. The power distribution box of claim 1, further comprising a lower housing and an upper housing, wherein the circuit board is disposed between the lower housing and the upper housing and further comprises a circuit board through hole through which the screw shank and sleeve extend.

6. The power distribution box of claim 1, further comprising a nut and a terminal, wherein a portion of the terminal is disposed between the nut and a longitudinal end of the sleeve and the terminal is electrically coupled to at least one of the screw and the sleeve.

7. The power distribution box of claim 1, wherein the sleeve further comprises a first longitudinal end, a second longitudinal end opposite the first longitudinal end, and a lip disposed between the first and second longitudinal ends, the lip being configured to abut an internal surface of the power distribution box to constrain axial movement of at least the sleeve.

8. The power distribution box of claim 7, further comprising an upper housing, wherein the upper housing includes the internal surface.

9. The power distribution box of claim 7, wherein the lip of the sleeve is an annular ring extending radially outwardly from an outer surface of the sleeve.

10. The power distribution box of claim 1, wherein a first longitudinal end of the sleeve is axially disposed on a first side of the circuit board and a second longitudinal end of the sleeve opposite the first longitudinal end is axially disposed on a second side of the circuit board opposite the first side of circuit board.

11. The power distribution box of claim 1, wherein a shoulder of the screw head abuts a first side of the busbar and a second side of the busbar opposite the first side of the busbar abuts a first longitudinal end of the sleeve.

12. The power distribution box of claim 1, wherein the busbar further comprises a generally flat portion through which the busbar hole resides and at least one leg that extends through the circuit board.

13. The power distribution box of claim 1, wherein a height between the busbar and the circuit board is equal to or less than three millimeters.

14. The power distribution box of claim 1, wherein the sleeve comprises a first longitudinal end and a second longitudinal end, the first longitudinal end abuts the busbar, and the second longitudinal end is configured to abut a terminal.

15. A method of assembling a power distribution box, comprising:
providing a lower housing;
rotatably fixing a screw relative to the lower housing;
providing a circuit board;
mounting a busbar to the circuit board such that the busbar is electrically coupled to the circuit board;
mounting the circuit board to the lower housing such that a screw shank of the screw extends through the busbar and the circuit board; and
inserting a sleeve over the screw shank such that a first longitudinal end of the sleeve abuts the busbar such that at least one of the screw and the sleeve is electrically coupled to the busbar.

16. The method of claim 15, further comprising providing an upper housing and mounting the upper housing to the lower housing such that a longitudinal end of the screw shank is exposed through the upper housing.

17. The method of claim 15, wherein mounting the busbar to the circuit board comprises soldering the busbar to the circuit board.

18. The method of claim 16, wherein the sleeve comprises a lip disposed between the first longitudinal end of the sleeve and a second longitudinal end of the sleeve opposite the first longitudinal end, the lip being configured to abut an internal surface of the upper housing to constrain axial movement of at least the sleeve.

19. The method of claim 15, wherein the first longitudinal end of the sleeve is axially disposed on a first side of the circuit board and a second longitudinal end of the sleeve opposite the first longitudinal end is axially disposed on a second side of the circuit board opposite the first side of the circuit board.

20. The method of claim 15, wherein a height between the busbar and the circuit board is equal to or less than three millimeters.

* * * * *